United States Patent
Liu et al.

(10) Patent No.: US 12,283,849 B2
(45) Date of Patent: Apr. 22, 2025

(54) MOTOR CONTROLLER AND VEHICLE HAVING SAME

(71) Applicant: BYD COMPANY LIMITED, Guangdong (CN)

(72) Inventors: Yuzhuo Liu, Shenzhen (CN); Wanguo Chen, Shenzhen (CN); Xingchun Zhang, Shenzhen (CN)

(73) Assignee: BYD COMPANY LIMITED, Shenzhen (CN)

( * ) Notice: Subject to any disclaimer, the term of this patent is extended or adjusted under 35 U.S.C. 154(b) by 265 days.

(21) Appl. No.: 17/992,989

(22) Filed: Nov. 23, 2022

(65) Prior Publication Data

US 2023/0079752 A1 Mar. 16, 2023

Related U.S. Application Data

(63) Continuation of application No. PCT/CN2021/094671, filed on May 19, 2021.

(30) Foreign Application Priority Data

May 27, 2020 (CN) .......................... 202020926651.4

(51) Int. Cl.
*H02K 11/33* (2016.01)
*H02K 5/22* (2006.01)

(52) U.S. Cl.
CPC ............... *H02K 11/33* (2016.01); *H02K 5/22* (2013.01)

(58) Field of Classification Search
CPC ............. H02K 11/33; H02K 1/00; H02K 7/08
USPC ................................................ 310/68 R, 71
See application file for complete search history.

(56) References Cited

U.S. PATENT DOCUMENTS

| 2013/0265724 A1* | 10/2013 | Kaneko | H01L 25/18 361/715 |
| 2013/0265808 A1* | 10/2013 | Ishii | H02M 1/12 363/97 |
| 2014/0126154 A1 | 5/2014 | Higuchi et al. | |

FOREIGN PATENT DOCUMENTS

| CN | 203734459 U | | 7/2014 |
| CN | 204928654 U | * | 12/2015 |
| CN | 207790572 U | | 8/2018 |
| CN | 107294312 B | | 5/2019 |
| CN | 110247520 A | | 9/2019 |
| CN | 111130277 A | | 5/2020 |
| CN | 212231286 U | | 12/2020 |
| EP | 2149973 A2 | | 2/2010 |
| JP | 2012139041 A | | 7/2012 |
| JP | 2014-143775 A | | 8/2014 |

(Continued)

OTHER PUBLICATIONS

International Search Report and Written Opinion for Application No. PCT/CN2021/094671, mailed on Aug. 19, 2021, 9 pages.

*Primary Examiner* — Jose A Gonzalez Quinones

(57) ABSTRACT

A motor controller and a vehicle having the same are disclosed in the present disclosure. The motor controller includes a box, a low-voltage control unit, a driver unit, and a power unit. A low-voltage control layer, a driver layer and a power layer sequentially laminated are defined in the box. The low-voltage control unit is arranged in the low-voltage control layer. The driver unit is arranged in the driver layer. The power unit is arranged in the power layer. A part of the box located between the low-voltage control layer and the driver layer is an electromagnetic shield.

21 Claims, 7 Drawing Sheets

(56) References Cited

FOREIGN PATENT DOCUMENTS

JP  2019052943 A  *  4/2019

* cited by examiner

MOTOR CONTROLLER AND VEHICLE HAVING SAME

CROSS-REFERENCE TO RELATED APPLICATIONS

The application is a continuation application of International Patent Application No. PCT/CN2021/094671 filed with the China National Intellectual Property Administration (CNIPA) on May 19, 2021, which is based on and claims priority to and benefits of Chinese Patent Application No. 202020926651.4, entitled "MOTOR CONTROLLER AND VEHICLE HAVING SAME" and filed on May 27, 2020. The above-referenced applications are incorporated herein by reference in their entirety.

FIELD

The present disclosure relates to the field of motor control technologies, and specifically, to a motor controller and a vehicle having the same.

BACKGROUND

In the related art, to improve the integration level, a motor controller of a vehicle is integrated with a dual motor control function. The integrated motor controller adopts a laminated structure, which reduces the overall volume of the motor controller to a certain extent. However, such motor controllers have poor electromagnetic compatibility (EMC), poor anti-interference ability, and high external radiation intensity, which is likely to affect other functions of the entire vehicle.

SUMMARY

The present disclosure is to resolve at least one of the technical problems in the related art. For this, the present disclosure provides a motor controller, where the motor controller has advantages of compact structure, good electromagnetic compatibility, strong anti-interference ability, and low external radiation intensity.

The present disclosure further provides a vehicle having the foregoing motor controller.

According to an embodiment of a first aspect of the present disclosure, a motor controller is provided. The motor controller includes: a box, wherein a low-voltage control layer, a driver layer, and a power layer are sequentially laminated in the box; a low-voltage control unit in the low-voltage control layer; a driver unit in the driver layer; and a power unit in the power layer. A part of the box located between the low-voltage control layer and the driver layer is an electromagnetic shield.

The motor controller according to this embodiment of the present disclosure has the advantages of compact structure, good electromagnetic compatibility, strong anti-interference ability, and low external radiation intensity.

According to some embodiments of the present disclosure, the box includes: a first box; a first cover plate, wherein the first cover plate is mounted on a side of the first box and jointly defines the low-voltage control layer with the first box; a second box, wherein the second box is mounted on the other side of the first box and jointly defines the driver layer with the first box; and a second cover plate, wherein the second cover plate is mounted on a side of the second box that is away from the first box and jointly defines the power layer with the second box. The electromagnetic shield is formed on a side of the first box that faces the second box.

According to some embodiments of the present disclosure, the low-voltage control unit includes: a low-voltage integrated control board in the first box; a dump load resistor in the first box; and a low-voltage inserting terminal in the low-voltage integrated control board and exposed from the first cover plate.

According to some embodiments of the present disclosure, the driver unit includes: a first IGBT module assembly and a second IGBT module assembly, wherein the first IGBT module assembly and the second IGBT module assembly are arranged in the second box; and a direct current hall and an alternating current hall, wherein the direct current hall and the alternating current hall are arranged in the second box.

According to some embodiments of the present disclosure, the motor controller further includes: a first magnetic ring, wherein the first IGBT module assembly comprises a first IGBT module and a first driving board, the first driving board is connected to the low-voltage control unit through a first signal line, and the first magnetic ring is sleeved over the first signal line; and a second magnetic ring, wherein the second IGBT module assembly comprises a second IGBT module and a second driving board, the second driving board is connected to the low-voltage control unit through a second signal line, and the second magnetic ring is sleeved over the second signal line.

According to some embodiments of the present disclosure, the power unit includes: a boost circuit in the second box; a direct current connector connected to the boost circuit and extending out of the second box; and a power distribution connector connected to the boost circuit and extending out of the second box.

According to some embodiments of the present disclosure, the boost circuit includes a capacitor and an inductor, and the capacitor is integrated with a third magnetic ring.

According to some embodiments of the present disclosure, the boost circuit includes a capacitor and an inductor, and the capacitor is integrated with a Y capacitor.

According to some embodiments of the present disclosure, the boost circuit includes a capacitor and an inductor, and the capacitor is integrated with a third magnetic ring and a Y capacitor.

According to some embodiments of the present disclosure, the box is configured with a coolant passage, and the coolant passage is located between the driver layer and the power layer and is configured to dissipate heat from the driver unit and the power unit.

According to some embodiments of the present disclosure, the motor controller further includes: an inlet tube connected to one end of the coolant passage and an outlet tube connected to another end of the coolant passage. The inlet tube and the outlet tube are respectively arranged on two opposing side walls of the box.

According to an embodiment of a second aspect of the present disclosure, a vehicle is provided. The vehicle includes the motor controller according to the embodiment of the first aspect of the present disclosure.

Through the motor controller according to the embodiment of the first aspect of the present disclosure, the vehicle according to the embodiment of the second aspect of the present disclosure has the advantages of compact structure, good electromagnetic compatibility, strong anti-interference ability, low external radiation intensity, and high space utilization rate.

Other aspects and advantages of the present disclosure are given in the following description, some of which become apparent from the following description or may be learned from practices of the present disclosure.

BRIEF DESCRIPTION OF THE DRAWINGS

Advantages of the foregoing and additional aspects of the present disclosure will become apparent and comprehensible in the description made with reference to the following accompanying drawings, in which.

Figure 1:
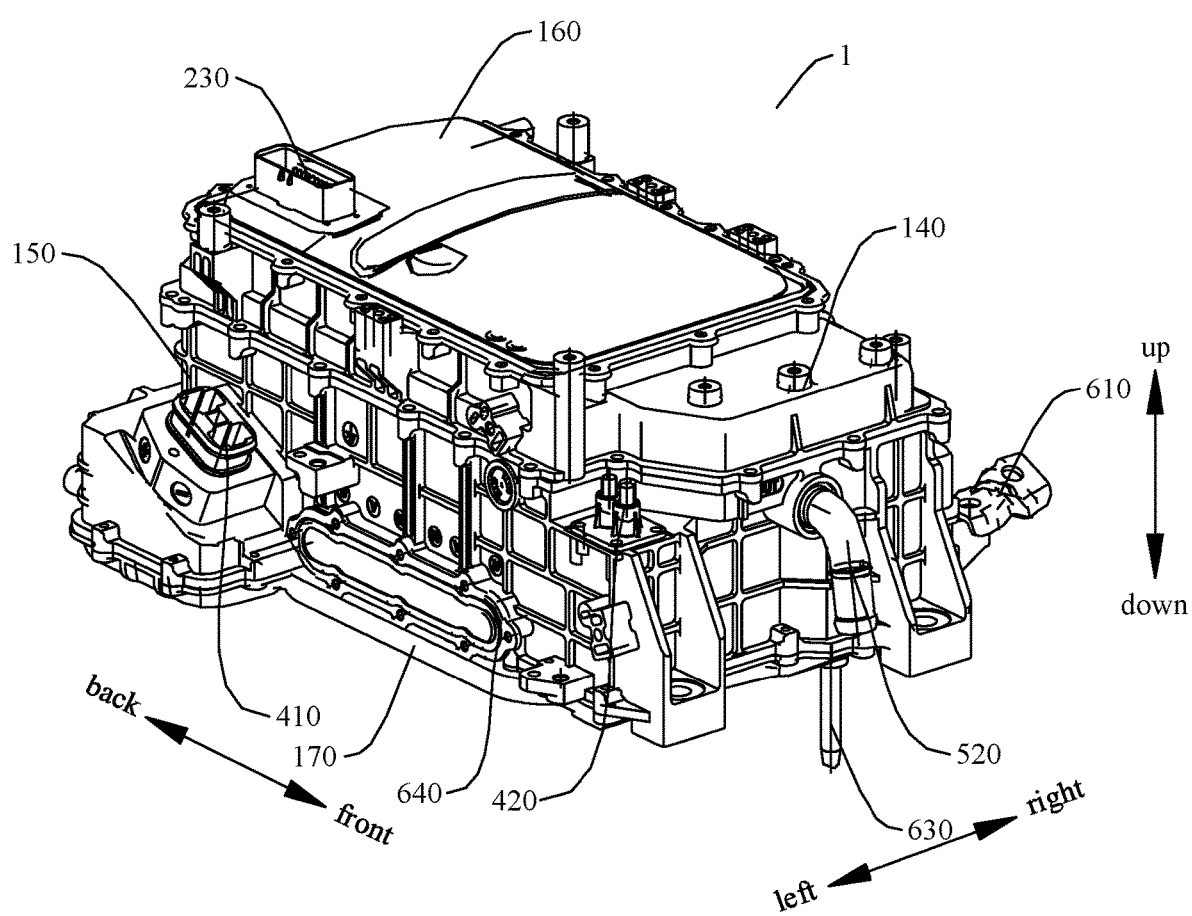
FIG. 1 is a schematic structural diagram of a motor controller according to an embodiment of the present disclosure.

REFERENCE NUMERALS motor controller 1, box 100, low-voltage control layer 110, driver layer 120, power layer 130, first box 140, second box 150, first cover plate 160, second cover plate 170, low-voltage control unit 200, low-voltage integrated control board 210, dump load resistor 220, low-voltage inserting terminal 230, first signal line 240, second signal line 250, driver unit 300, first IGBT module 310, second IGBT module 320, first driving board 330, second driving board 340, direct current hall 350, alternating current hall 360, first magnetic ring 370, second magnetic ring 380, power unit 400, direct current connector 410, power distribution connector 420, capacitor 430, inductor 440, coolant passage 500, inlet tube 510, outlet tube 520, movable supporting leg 610, three-phase line injection molded part 620, positioning pin 630, three-phase line cap 640, vehicle 1000.

DETAILED DESCRIPTION

The embodiments of the present disclosure are described in detail below, and the embodiments described with reference to accompanying drawings are exemplary.

In the description of the present disclosure, it should be understood that, orientations or position relationships indicated by terms such as "center", "longitudinal", "transverse", "length", "width", "thickness", "up", "down", "front", "back", "left", "right", "vertical", "horizontal", "top", "bottom", "inner", "outer", "clockwise", "counterclockwise", "axial", "radial", and "circumferential" are orientations or position relationship shown based on the accompanying drawings, and are merely used for describing the present disclosure and simplifying the description, rather than indicating or implying that the apparatus or element should have a particular orientation or be constructed and operated in a particular orientation, and therefore, should not be construed as a limitation on the present disclosure. In the description of the present disclosure, "a plurality of" means two or more than two.

A motor controller 1 according to an embodiment of the present disclosure is described with reference to accompanying drawings. As shown in FIG. 1 to FIG. 7, the motor controller 1 according to the present disclosure includes a box 100, a low-voltage control unit 200, a driver unit 300, and a power unit 400.

A low-voltage control layer 110, a driver layer 120, and a power layer 130 are sequentially laminated in the box 100. The low-voltage control unit 200 is arranged in the low-voltage control layer 110. The driver unit 300 is arranged in the driver layer 120. The power unit 400 is arranged in the power layer 130. A part of the box 100 located between the low-voltage control layer 110 and the driver layer 120 is an electromagnetic shield.

For example, an operating voltage of the low-voltage control unit 200 ranges from 6 V to 12 V, for example, 8 V. An operating power of the power unit 400 ranges from 600 µF to 800 µF. The electromagnetic shield is made of a metal material. The low-voltage control layer 110, the driver layer 120 and the power layer 130 are arranged at intervals along an up and down direction of the box 100, and the driver layer 120 is located between the low-voltage control layer 110 and the power layer 130. In other words, the low-voltage control layer 110, the driver layer 120 and the power layer 130 are arranged in sequence along the up and down direction. An operating voltage of the power unit 300 is much higher than the operating voltage of the low-voltage control unit 200. The operating power of the power unit 400 is higher than an operating power of the driver unit 300 and an operating power of the low-voltage control unit 200.

The motor controller 1 according to this embodiment of the present disclosure defines the low-voltage control layer 110, the driver layer 120, and the power layer 130 sequentially laminated in the box 100. The low-voltage control unit 200 is arranged in the low-voltage control layer 110, the power unit 300 is arranged in the power layer 120, and the part of the box 100 arranged between the low-voltage control layer 110 and the power layer 120 is the electromagnetic shield. Since the operating voltage of the driver unit 300 is much higher than the operating voltage of the low-voltage control unit 200, the driver unit 300 has relatively strong electromagnetic interference to the low-voltage control unit 200 in work. Therefore, through layering the low-voltage control unit 200 and the driver unit 300, a distance between the low-voltage control unit 200 and the driver unit 300 is increased, electromagnetic compatibility (EMC) of the low-voltage control unit 200 and the driver unit 300 is improved, and the electromagnetic shield arranged in the low-voltage control unit 200 and the driver unit 300 may avoid radiation interference of the driver unit 300. An interference signal of the driver unit 300 is weakened by the electromagnetic shield before reaching the low-voltage control unit 200. In this way, the electromagnetic compatibility between the low-voltage control unit 200 and the driver unit 300 is further improved, an anti-interference ability is improved, and external radiation intensity is reduced.

In addition, the power unit 400 is arranged in the power layer 130. It may be understood that the operating power of the power unit 400 is much higher than that of the low-voltage control unit 200 and driver unit 300. Therefore, a volume of the power unit 400 is much larger than a volume of the low-voltage control unit 200 and the driver unit 300. The power unit 400 is arranged alone in a layer of the box 100. The power unit 400 with a large volume may be uniformly placed. Combined with a laminated structure of the motor controller 1, a compact extent of the motor controller 1 is improved, which may greatly decrease a volume of the motor controller 1 and facilitate the miniaturization of the motor controller 1.

In this way, the motor controller 1 according to the present disclosure has the advantages of compact structure, good electromagnetic compatibility, strong anti-interference ability, and low external radiation intensity.

Figure 3:
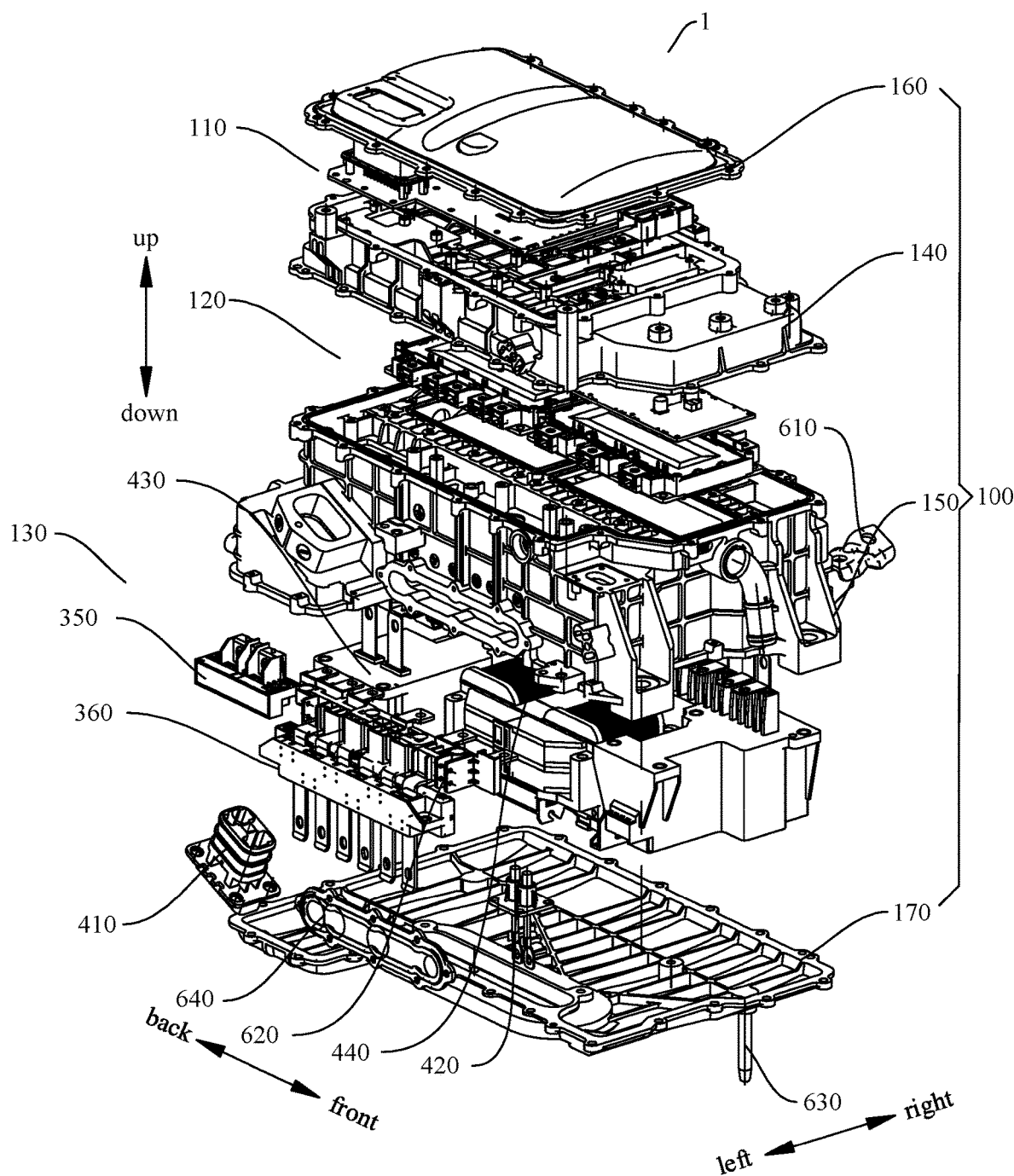
FIG. 3 is an exploded view of the motor controller according to an embodiment of the present disclosure.

According to some embodiments of the present disclosure, as shown in FIG. 3, the box 100 includes a first box 140, a second box 150, a first cover plate 160 and a second cover plate 170.

The first cover plate 160 is mounted on a side of the first box 140 and jointly defines the low-voltage control layer 110 with the first box 140. The second box 150 is mounted on the other side of the first box 140 and jointly defines the driver layer 120 with the first box 140. The second cover plate 170 is mounted on a side of the second box 150 that is away from the first box 140 and jointly defines the power layer 130 with the second box 150. The electromagnetic shield is formed on a side of the first box 140 that faces the second box 150. In this way, a small volume of the motor controller 1 is ensured, and an overall structure stability of the motor controller 1 is improved.

For example, the first cover plate 160 is mounted above the first box 140, the second box 150 is mounted below the first box 140, and the second cover plate 170 is mounted below the second box 150. The electromagnetic shield is formed below the first box 140, and multiple hollow parts are arranged in the second cover plate 170 to decrease an overall weight of the motor controller 1 and reduce costs.

Figure 4:
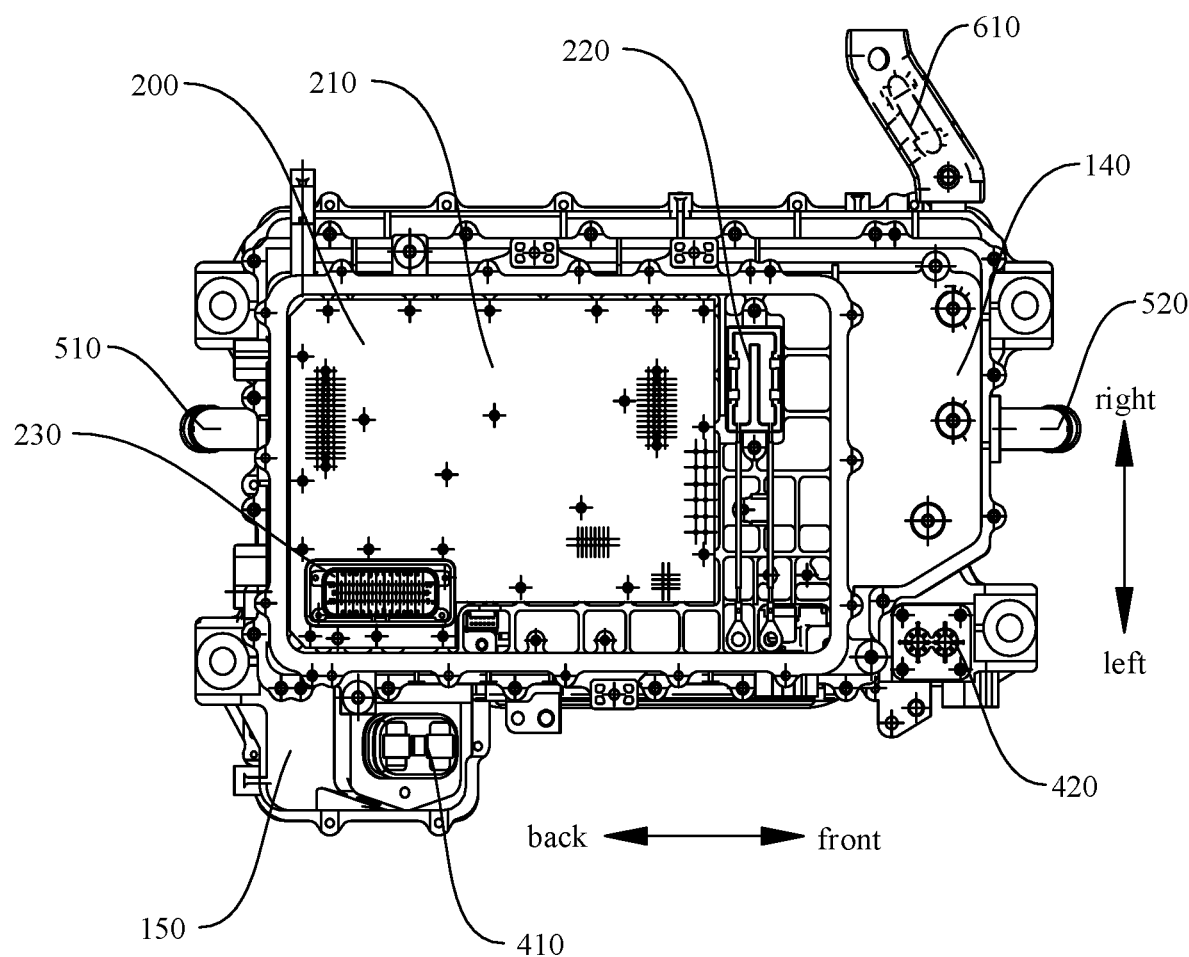
FIG. 4 is a schematic layout diagram of a low-voltage control layer of the motor controller according to an embodiment of the present disclosure.

According to some embodiments of the present disclosure, as shown in FIG. 4, the low-voltage control unit 200 includes a low-voltage integrated control board 210, a dump load resistor 220 and a low-voltage inserting terminal 230. The low-voltage integrated control board 210 is arranged in the first box 140, the dump load resistor 220 is arranged in the first box 140, and the low-voltage inserting terminal 230 is arranged in the low-voltage integrated control board 210 and is exposed from the first cover plate 160.

As shown in FIG. 4, the low-voltage control unit 200 and the low-voltage inserting terminal 230 are located in the back side of the first box 140. The low-voltage inserting terminal 230 is located in a left back side area of the low-voltage control unit 200. The low-voltage inserting terminal 230 is above the low-voltage control unit 200 and is connected to the low-voltage control unit 200. The dump load resistor 220 is located in the right front of the low-voltage control unit 200.

For example, the low-voltage integrated control board 210 is electrically connected to a vehicle control unit (VCU) through the low-voltage inserting terminal 230. The low-voltage integrated control board 210 controls the operation of a vehicle motor according to a signal of the vehicle control unit. The dump load resistor 220 is configured to consume energy stored in a capacitor element in the motor controller 1. 2 mins to 3 mins are required in discharging the energy stored in the capacitor element. In this way, a user is prevented from getting an electric shock when the user disassembles the motor controller 1, and reliability of the motor controller 1 is improved.

Figure 7:
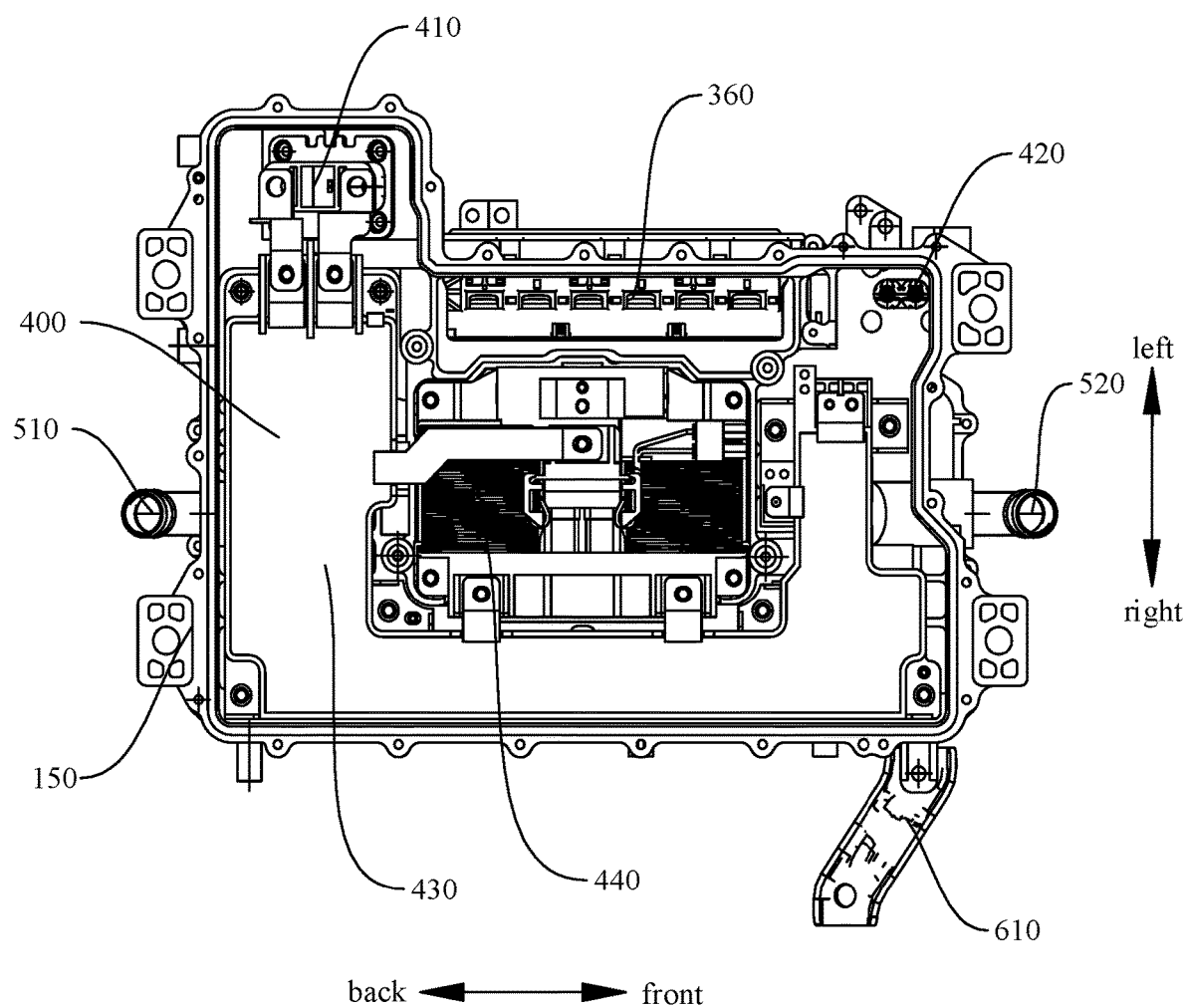
FIG. 7 is a schematic layout diagram of a power layer of the motor controller according to an embodiment of the present disclosure.
Figure 8:
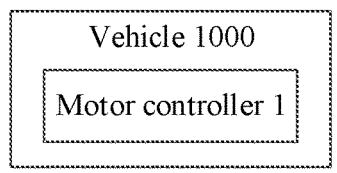
FIG. 8 is a block diagram of a vehicle according to an embodiment of the present disclosure.

According to some embodiments of the present disclosure, as shown in FIG. 7, the power unit 400 includes a boost circuit, a direct current connector 410 and a power distribution connector 420. The boost circuit is arranged in the second box 150. The direct current connector 410 is connected to the boost circuit and extends out of the second box 150. The power distribution connector 420 is connected to the boost circuit and extends out of the second box 150.

According to some embodiments of the present disclosure, the boost circuit includes a capacitor 430 and an inductor 440, and the capacitor 430 is integrated with a third magnetic ring.

According to some other embodiments of the present disclosure, the boost circuit includes a capacitor 430 and an inductor 440, and the capacitor 430 is integrated with a Y capacitor.

According to some other embodiments of the present disclosure, the boost circuit includes a capacitor 430 and an inductor 440, and the capacitor 430 is integrated with a third magnetic ring and a Y capacitor.

As shown in FIG. 7, the inductor 440 is located in a central area of a down surface of the second box 150, the capacitor 430 surrounds the inductor 440 along a circumferential direction of the inductor 440. The direct current connector 410 is located in a right back side area of the down surface of the second box 150. The power distribution connector 420 is located in a right front side area of the down surface of the second box 150.

For example, the capacitor 430 may be a film capacitor. The capacitor 430 is further integrated with a bus capacitor and a boost capacitor. The dump load resistor 220 is mainly configured to consume the electric energy in the bus capacitor. The boost circuit is composed of the bus capacitor and the inductor 440. The direct current connector 410 is connected to a power in a vehicle. The boost circuit is connected to the direct current connector 410 and the power distribution connector 420 respectively. The electric energy of the power flows to the boost circuit after passing through the direct current connector 410, and flows to the power distribution connector 420 after the electric energy is boosted by the boost circuit. The power distribution connector 420 may provide electricity to an electric equipment (for example, an air conditioner) of the vehicle.

In addition, the Y capacitor and the third magnetic ring are arranged in an entry of the capacitor 430. It may be understood that there is electromagnetic interference between a direct current and an alternating current. The Y capacitor may inhibit common-mode interference, and the third magnetic ring may improve the anti-interference ability of the capacitor 430. In this way, the electromagnetic compatibility of the motor controller 1 is further improved. In addition, the direct current connector 410 and the power distribution connector 420 are respectively arranged in two ends of the motor controller 1, and the electromagnetic interference is prevented from occurring between a current in the direct current connector 410 and a current in the power distribution connector 420, thereby improving the electromagnetic compatibility of the motor controller 1.

Figure 5:
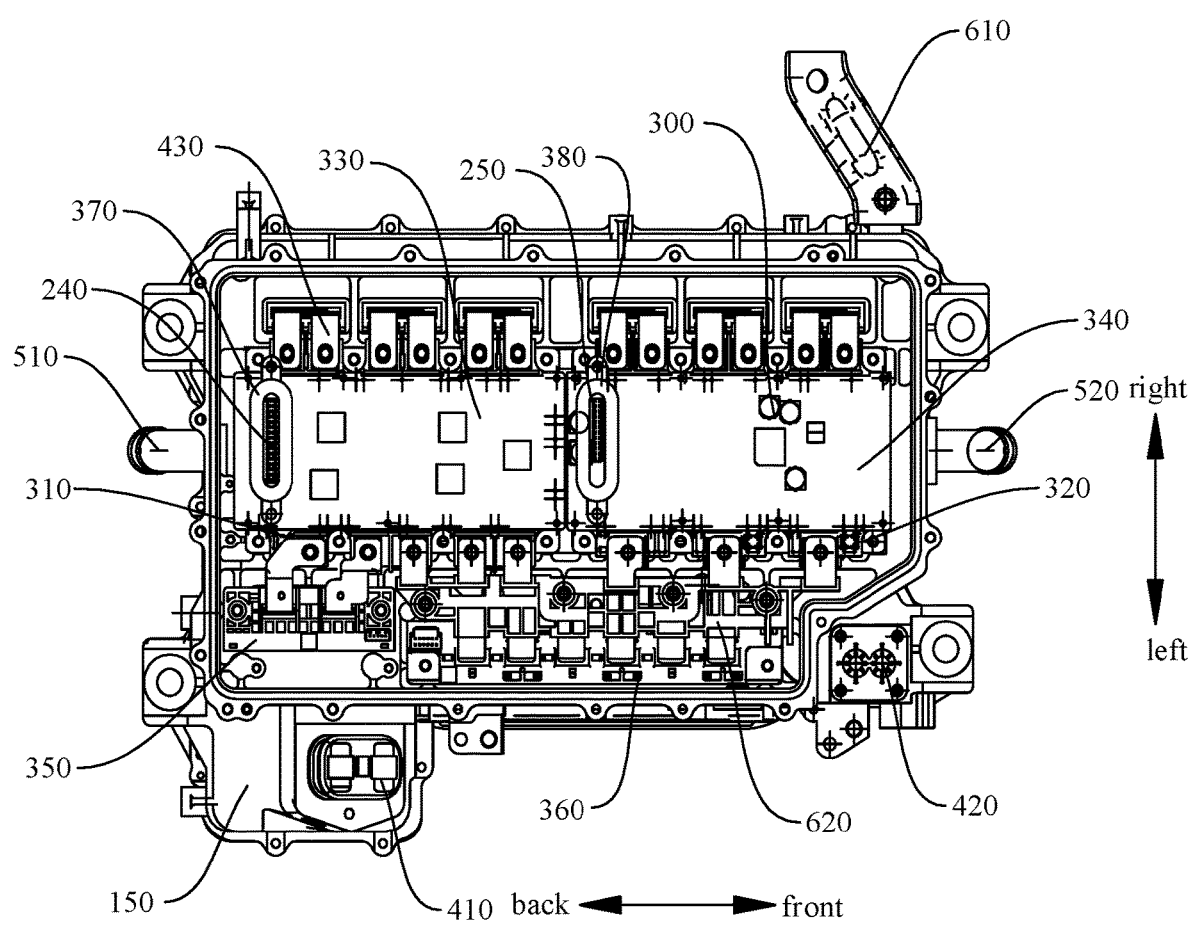
FIG. 5 is a schematic layout diagram of a driver layer of the motor controller according to an embodiment of the present disclosure.

According to some embodiments of the present disclosure, as shown in FIG. 5, the driver unit 300 includes a first IGBT module assembly, a second IGBT module assembly, a direct current hall 350, and an alternating current hall 360. The first IGBT module assembly and the second IGBT module assembly are arranged in the second box 150. The direct current hall 350 and the alternating current hall 360 are arranged in the second box 150.

The motor controller 1 further includes a first magnetic ring 370 and a second magnetic ring 380. The first IGBT module assembly includes a first IGBT module 310 and a first driving board 330. The first driving board 330 is connected to the low-voltage control unit 200 through a first signal line 240. The first magnetic ring 370 is sleeved over the first signal line 240. The second IGBT module assembly includes a second IGBT module 320 and a second driving board 340. The second driving board 340 is connected to the low-voltage control unit 200 through a second signal line 250. The second magnetic ring 380 is sleeved over the second signal line 250.

As shown in FIG. 5, the first IGBT module assembly and the second IGBT module assembly are arranged at intervals along a front and back direction. The first signal line 240 is mounted on the first driving board 330 and is located in a back side area of the first driving board 330. The second signal line 250 is mounted on the second driving board 340 and is located in a back side area of the second driving board 340. The first IGBT module 310 is located in the left side of the first driving board 330. The second IGBT module 320 is located in the left side of the second driving board 340. The first magnetic ring 370 is sleeved over the first signal line 240 and is located above the first driving board 330. The second magnetic ring 380 is sleeved over the second signal line 250 and is located above the second driving board 340. The alternating current hall 360 and the direct current hall 350 are both located on the left side of the first IGBT module and the second IGBT module. The alternating current hall 360 is located in front of the direct current hall 350. In addition, as shown in FIG. 7, a part of the alternating current hall 360 is located on the down surface of the second box 150, and the part is located on the left side of the inductor 440 and is located between the direct current connector 410 and the power distribution connector 420 in a front and back direction.

For example, the direct current hall 350 collects a direct current signal between the capacitor 430 and two IGBT module assemblies. The alternating current hall 360 collects an alternating current signal between three-phase output ends of the two IGBT modules and the capacitor 430. As shown in FIG. 5, at least a part of the capacitor 430 extends into the driver layer 120 and is connected to the two IGBT module assemblies respectively. The direct current hall 350 and the alternating current hall 360 feedback a result to the low-voltage integrated control board 210. The low-voltage integrated control board 210 may adjust a parameter of a motor according to the feedback to ensure a normal operation of the vehicle.

The first signal line 240 and the second signal line 250 may both be pulse width modulation (PWM) lines. Since a magnetic ring may improve the anti-interference ability of a circuit and inhibit noise, the first magnetic ring 370 and the second magnetic ring 380 may further prevent the high voltage interference of the driver unit 300 from being coupled to the low-voltage integrated control board 210, and further improve the EMC of the motor controller 1.

Figure 2:
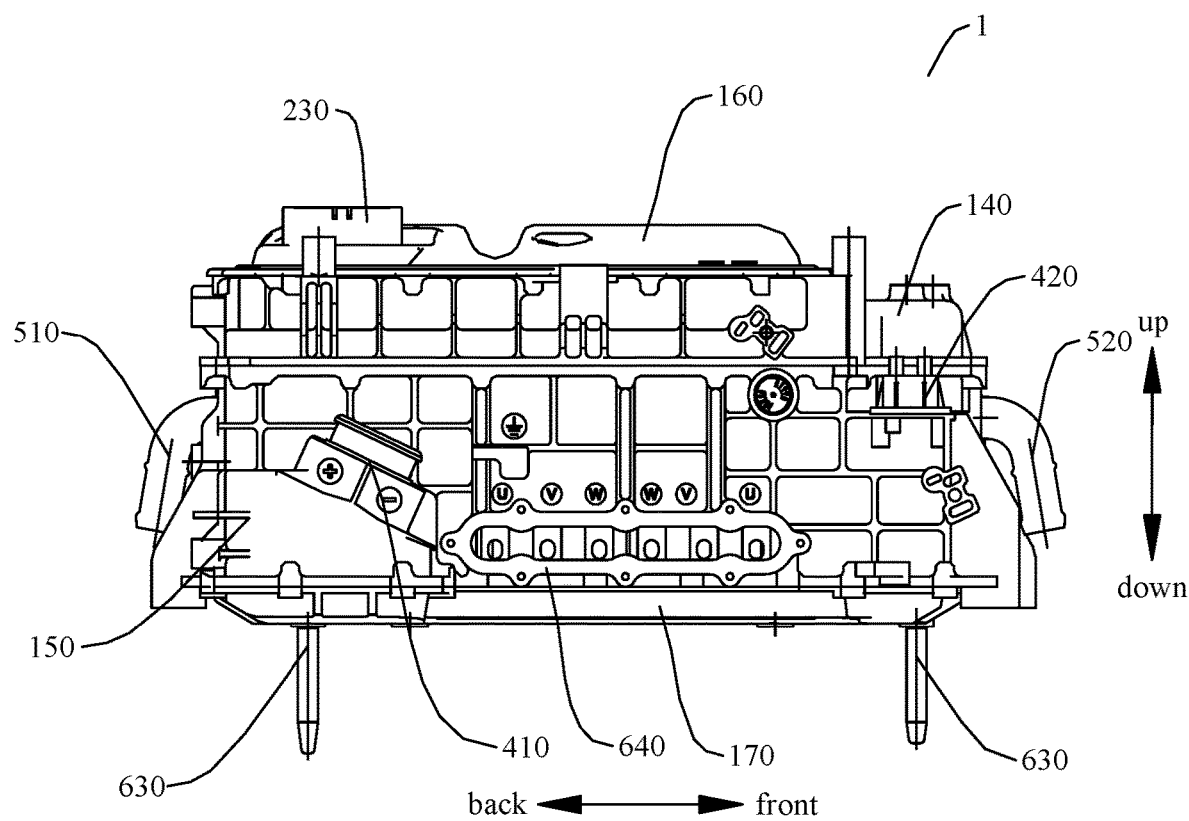
FIG. 2 is a front view of the motor controller according to an embodiment of the present disclosure.

In addition, the motor controller 1 further includes a three-phase line injection molded part 620 and a three-phase line cap 640. The three-phase line injection molded part 620 is configured to fix a copper busbar of the three-phase output of the two IGBT modules 310. The three-phase line injection molded part 620 is an insulating member, which may reduce the high voltage of the copper busbar to flow into the box 100, not only avoiding a connection between the high voltage of the motor controller 1 and other devices of the vehicle and improving the using safety of the motor controller 1, but also reducing external radiation intensity of the motor controller 1. As shown in FIG. 1 and FIG. 2, the three-phase line cap 640 constitutes a three-phase socket of the motor controller 1, and the motor of the vehicle may be electrically connected to the motor controller 1 through the three-phase socket constituted by the three-phase line cup 640.

Figure 6:
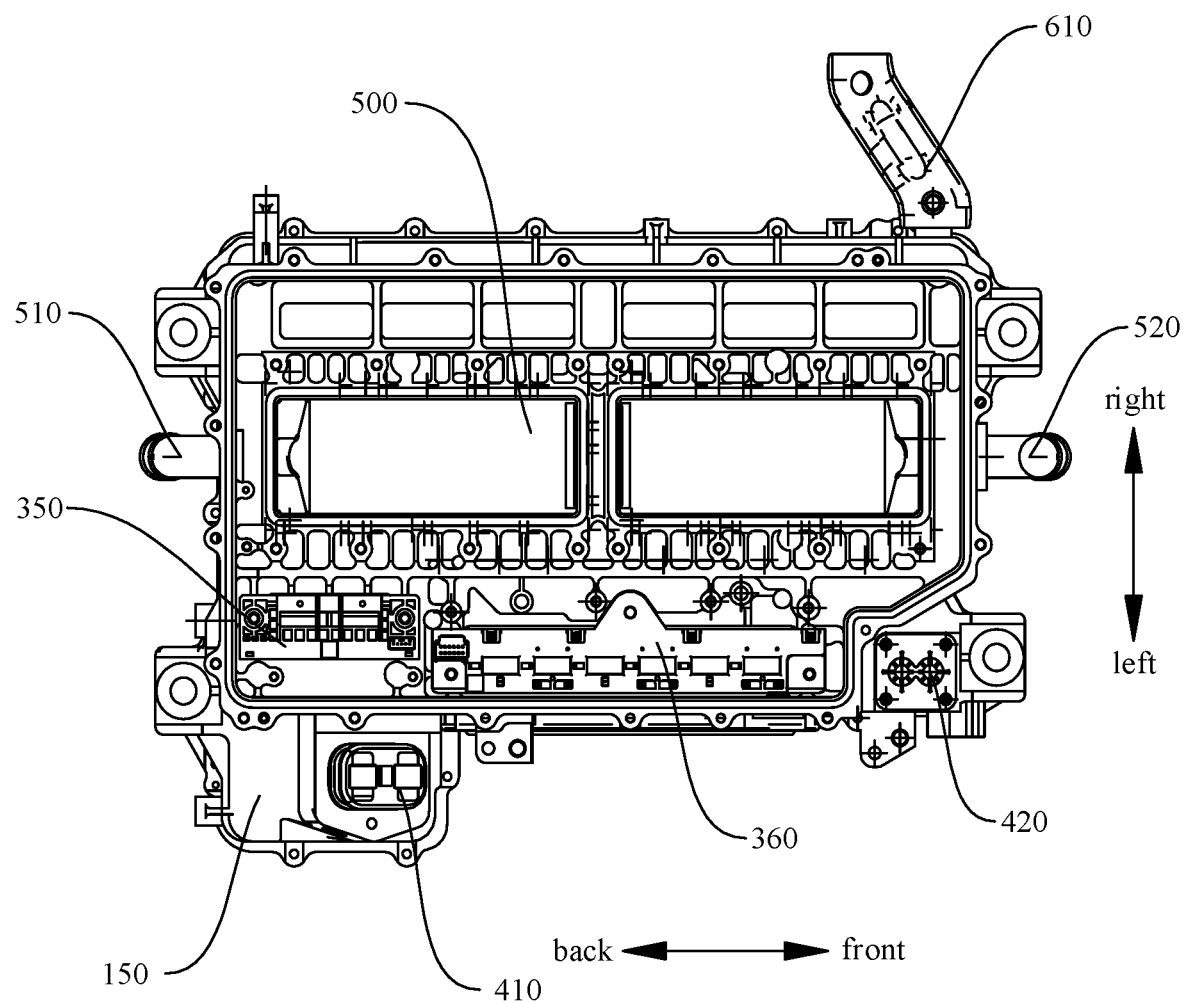
FIG. 6 is a top view of a second box of the motor controller according to an embodiment of the present disclosure.

According to some embodiments of the present disclosure, as shown in FIG. 6, the box 100 is configured with a coolant passage 500. The coolant passage 500 is located between the driver layer 120 and the power layer 130 and is configured to dissipate heat from the driver unit 300 and the power unit 400.

In some embodiments of the present disclosure, the second box 150 is configured with the coolant passage 500. The second box 150 is configured with the coolant passage 500 by adopting a friction welding manner during production. The coolant passage 500 and the second box 150 are integrally molded. Compared with a cooling water passage defined by separately producing the second box 150 and then mounting a water passage board in the related art, an assembly process is simplified, production efficiency is improved, and the structure stability between the coolant passage 500 and the second box 150 is higher.

The first IGBT module assembly and the second IGBT module assembly in driver unit 300 generate heat during an operation process. Coolant (for example, water) in the coolant passage 500 may improve heat-dissipation efficiency of the first IGBT module assembly and the second IGBT module assembly, to ensure operation efficiency of the first IGBT module assembly and the second IGBT module assembly, and prevent the first IGBT module assembly and the second IGBT module assembly from being damaged due to too much heat. In addition, the capacitor 430 and the inductor 440 in the power unit 400 also generate heat. The coolant (for example, water) in the coolant passage 500 may improve heat-dissipation efficiency of the capacitor 430 and the inductor 440, to ensure operation efficiency of the capacitor 430 and the inductor 440, and prevent the capacitor 430 and the inductor 440 from being damaged due to too much heat. In this way, the reliability of the motor controller 1 is improved.

In this way, the coolant passage 500 may dissipate heat for four devices: the two IGBT module assemblies, the capacitor 430 and the inductor 440 simultaneously, which greatly improve a space utilization rate of the motor controller 1, reduce a volume of the coolant passage 500, and improve an integration level of the motor controller 1, thereby facilitating the miniaturization of the motor controller 1.

According to some embodiments of the present disclosure, as shown in FIG. 6, the motor controller 1 further includes an inlet tube 510 and an outlet tube 520. The inlet tube 510 is connected to one end of the coolant passage 500. The outlet tube 520 is connected to another end of the coolant passage 500. The inlet tube 510 and the outlet tube 520 are respectively arranged on two opposing side walls of the box 100.

For example, the coolant passage 500 extends along a length direction of the motor controller 1. The two IGBT module assemblies are arranged at intervals along a length direction of the coolant passage 500, and a length direction of each IGBT module is the same as the length direction of the coolant passage 500. The arrangement of the inlet tube 510 and the outlet tube 520 facilitates an instant and continuous change of coolant in the coolant passage 500 to ensure cooling efficiency of the coolant passage 500. In addition, the inlet tube 510 and the outlet tube 520 are located on two ends of the coolant passage 500 in the length direction. In this way, a flowing direction of the coolant in the coolant passage 500 is the same as an arranged direction of the two IGBT module assemblies. The coolant fully flows through the two IGBT module assemblies, which ensures a contact area of the coolant and the two IGBT module assemblies and an improved heat-dissipation effect.

A vehicle 1000 according to an embodiment of the present disclosure is described with reference to accompanying drawings. The vehicle 1000 includes the motor controller 1 according to this embodiment of the present disclosure.

For example, as shown in FIG. 1 to FIG. 8, the motor controller 1 further includes a movable supporting leg 610 and a positioning pin 630. The movable supporting leg 610 may be detached from the box 100. The motor controller 1 may be mounted in different types of vehicles 1000 through changing the movable supporting leg 610, which improves the adaptability of the motor controller 1. In addition, the motor controller 1 improves the stability of the connection to the vehicle 1000 through the positioning pin 630.

Through the motor controller 1 according to this embodiment of the present disclosure, the vehicle 1000 according to this embodiment of the present disclosure has the advantages of compact structure, good electromagnetic compatibility, strong anti-interference ability, low external radiation intensity, and high space utilization rate.

Other configurations and operations of the motor controller 1 according to the embodiments of the present disclosure are known to those of ordinary skill in the art and will not be described in detail herein.

In the descriptions of this specification, descriptions using reference terms "an embodiment", "some embodiments", "an exemplary embodiment", "an example", "a specific example", or "some examples" mean that specific characteristics, structures, materials, or features described with reference to the embodiment or example are included in at least one embodiment or example of the present disclosure. In this specification, schematic descriptions of the foregoing terms do not necessarily point at a same embodiment or example.

Although the embodiments of the present disclosure have been shown and described, a person of ordinary skill in the art should understand that various changes, modifications, replacements and variations may be made to the embodiments without departing from the principles and spirit of the present disclosure, and the scope of the present disclosure is as defined by the appended claims and their equivalents.

What is claimed is:

1. A motor controller, comprising:
   a box, wherein a low-voltage control layer, a driver layer, and a power layer are sequentially laminated in the box;
   a low-voltage control unit in the low-voltage control layer;
   a driver unit in the driver layer;
   a power unit in the power layer; and
   an electromagnetic shield between the low-voltage control layer and the driver layer;
   wherein the power layer comprises a capacitor and an inductor, the inductor of the power layer is located in a central area of a lower surface of the power layer, and the capacitor of the power layer surrounds the inductor of the power layer along a circumferential direction of the inductor of the power layer.

2. The motor controller according to claim 1, wherein the box comprises:
   a first box;
   a first cover plate, wherein the first cover plate is mounted on a side of the first box and jointly defines the low-voltage control layer with the first box;
   a second box, wherein the second box is mounted on the other side of the first box and jointly defines the driver layer with the first box; and
   a second cover plate, wherein the second cover plate is mounted on a side of the second box that is away from the first box and jointly defines the power layer with the second box;
   wherein the electromagnetic shield is formed on a side of the first box that faces the second box.

3. The motor controller according to claim 2, wherein the low-voltage control unit comprises:
   a low-voltage integrated control board in the first box;
   a dump load resistor in the first box; and
   a low-voltage inserting terminal in the low-voltage integrated control board and exposed from the first cover plate.

4. The motor controller according to claim 2, wherein the driver unit comprises:
   a first IGBT module assembly and a second IGBT module assembly in the second box; and
   a direct current hall and an alternating current hall in the second box.

5. The motor controller according to claim 4, further comprising:
   a first magnetic ring, wherein the first IGBT module assembly comprises a first IGBT module and a first driving board, the first driving board is connected to the low-voltage control unit through a first signal line, and the first magnetic ring is sleeved over the first signal line; and
   a second magnetic ring, wherein the second IGBT module assembly comprises a second IGBT module and a second driving board, the second driving board is connected to the low-voltage control unit through a second signal line, and the second magnetic ring is sleeved over the second signal line.

6. The motor controller according to claim 2, wherein the power unit comprises:
   a boost circuit in the second box;
   a direct current connector connected to the boost circuit and extending out of the second box; and
   a power distribution connector connected to the boost circuit and extending out of the second box.

7. The motor controller according to claim 6, wherein the boost circuit comprises a capacitor and an inductor, and the capacitor of the boost circuit is integrated with a third magnetic ring.

8. The motor controller according to claim 6, wherein the boost circuit comprises a capacitor and an inductor, and the capacitor of the boost circuit is integrated with a Y capacitor.

9. The motor controller according to claim 6, wherein the boost circuit comprises a capacitor and an inductor, and the capacitor is integrated with a third magnetic ring and a Y capacitor.

10. The motor controller according to claim 1, wherein the box is configured with a coolant passage, the coolant passage is located between the driver layer and the power layer, and the coolant passage is configured to dissipate heat from the driver unit and the power unit.

11. The motor controller according to claim 10, further comprising:
    an inlet tube connected to one end of the coolant passage; and
    an outlet tube connected to another end of the coolant passage,
    wherein the inlet tube and the outlet tube are respectively arranged on two opposing side walls of the box.

12. A vehicle, comprising the motor controller according to claim 1.

13. A motor controller, comprising:
a low-voltage control layer, a driver layer, and a power layer sequentially arranged;
a low-voltage control unit in the low-voltage control layer;
a driver unit in the driver layer;
a power unit in the power layer; and
an electromagnetic shield between the low-voltage control layer and the driver layer;
wherein the power layer comprises a capacitor and an inductor, the inductor of the power layer is located in a central area of a lower surface of the power layer, and the capacitor of the power layer surrounds the inductor of the power layer along a circumferential direction of the inductor of the power layer.

14. The motor controller according to claim 13, further comprising:
a first box and a first cover plate mounted on a side of the first box, wherein the first box and the first cover plate jointly define the low-voltage control layer;
a second box mounted on the other side of the first box, wherein the first box and the second box jointly define the driver layer; and
a second cover plate mounted on a side of the second box that is away from the first box, wherein the second box and the second cover plate jointly define the power layer,
wherein the electromagnetic shield is formed on a side of the first box that faces the second box.

15. The motor controller according to claim 14, wherein the low-voltage control unit comprises:
a low-voltage integrated control board in the first box;
a dump load resistor in the first box; and
a low-voltage inserting terminal in the low-voltage integrated control board and exposed from the first cover plate.

16. The motor controller according to claim 14, wherein the driver unit comprises:
a first IGBT module assembly and a second IGBT module assembly in the second box; and
a direct current hall and an alternating current hall in the second box.

17. The motor controller according to claim 16, further comprising:
a first magnetic ring, wherein the first IGBT module assembly comprises a first IGBT module and a first driving board, the first driving board is connected to the low-voltage control unit through a first signal line, and the first magnetic ring is sleeved over the first signal line; and
a second magnetic ring, wherein the second IGBT module assembly comprises a second IGBT module and a second driving board, the second driving board is connected to the low-voltage control unit through a second signal line, and the second magnetic ring is sleeved over the second signal line.

18. The motor controller according to claim 14, wherein the power unit comprises:
a boost circuit in the second box;
a direct current connector connected to the boost circuit and extending out of the second box; and
a power distribution connector connected to the boost circuit and extending out of the second box.

19. The motor controller according to claim 13, further comprising a coolant passage between the driver layer and the power layer, wherein the coolant passage is configured to dissipate heat from the driver unit and the power unit.

20. A vehicle, comprising the motor controller according to claim 13.

21. A motor controller, comprising:
a box, wherein a low-voltage control layer, a driver layer, and a power layer are sequentially laminated in the box;
a low-voltage control unit in the low-voltage control layer;
a driver unit in the driver layer;
a power unit in the power layer; and
an electromagnetic shield between the low-voltage control layer and the driver layer;
wherein the box comprises:
a first box;
a first cover plate, wherein the first cover plate is mounted on a side of the first box and jointly defines the low-voltage control layer with the first box;
a second box, wherein the second box is mounted on the other side of the first box and jointly defines the driver layer with the first box; and
a second cover plate, wherein the second cover plate is mounted on a side of the second box that is away from the first box and jointly defines the power layer with the second box;
wherein the electromagnetic shield is formed on a side of the first box that faces the second box; and
wherein the power unit comprises a boost circuit in the second box, a direct current connector connected to the boost circuit and extending out of the second box, a power distribution connector connected to the boost circuit and extending out of the second box.

* * * * *